United States Patent
Pullela et al.

(10) Patent No.: US 7,398,073 B2
(45) Date of Patent: Jul. 8, 2008

(54) LOW NOISE MIXER

(75) Inventors: Rajasekhar Pullela, Colton, CA (US);
Tirdad Sowlati, Irvine, CA (US);
Dmitriy Rozenblit, Irvine, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 486 days.

(21) Appl. No.: 11/220,030

(22) Filed: Sep. 6, 2005

(65) Prior Publication Data

US 2007/0054648 A1   Mar. 8, 2007

(51) Int. Cl.
*H04B 1/26* (2006.01)
(52) U.S. Cl. .................. 455/313; 455/315; 455/255; 455/293; 455/114.2
(58) Field of Classification Search .................. 455/313, 455/315, 255, 293, 114.2, 296, 189.1, 209
See application file for complete search history.

(56) References Cited

U.S. PATENT DOCUMENTS 6,269,253 B1 * 7/2001 Maegawa et al. ........ 455/552.1
2002/0055337 A1   5/2002 Persico et al.
2003/0021237 A1   1/2003 Min et al.
2003/0169089 A1 * 9/2003 Manku et al. ............... 327/359
2004/0077324 A1 * 4/2004 Wieck ..................... 455/234.1

FOREIGN PATENT DOCUMENTS

WO   WO 03/023983    3/2003
WO   WO 2004/001997  12/2003

* cited by examiner

*Primary Examiner*—Sanh D. Phu (57) ABSTRACT

A low noise mixer comprises a first mixer core configured to receive a radio frequency (RF) input signal having an RF frequency, and a first local oscillator signal, wherein the first local oscillator signal is at a frequency that is nominally twice the frequency of the RF frequency, the first mixer core configured to switch the RF input signal to at least one secondary mixer core at a frequency that coincides with the frequency of the first local oscillator signal, the at least one secondary mixer core configured to receive the switched RF input signal and a second local oscillator signal, where the second local oscillator signal is at the same nominal frequency as the RF input signal, and wherein switching the RF input signal at the frequency of the first local oscillator signal substantially eliminates flicker noise associated with the down-conversion process.

20 Claims, 5 Drawing Sheets

LOW NOISE MIXER

BACKGROUND

With the increasing availability of efficient, low cost electronic modules, mobile communication systems are becoming more and more prevalent. For example, there are many variations of communication schemes in which various frequencies, transmission schemes, modulation techniques and communication protocols are used to provide two-way voice and data communications in a handheld, telephone-like communication handset. The different modulation and transmission schemes each have advantages and disadvantages.

One of the advances in portable communication technology is the move toward the implementation of a low intermediate frequency (IF) transmitter and receiver and a direct conversion transmitter and receiver (DCR). A low IF receiver converts a radio frequency (RF) signal to an intermediate frequency that is lower than the IF of a conventional receiver. A direct conversion receiver downconverts a radio frequency (RF) received signal directly to baseband (DC) without first converting the RF signal to an intermediate frequency. One of the benefits of a direct conversion or low IF receiver is the elimination of costly filter components used in systems that employ an intermediate frequency conversion.

Another advance in portable communication technology is the move away from bipolar complementary metal oxide semiconductor (Bi-CMOS) technology and the move toward implementing receiver components completely in CMOS technology. Implementing the receiver components completely in CMOS technology reduces cost, power consumption and the physical space used on the device.

Unfortunately, implementing the receiver components using CMOS technology results in the increase in some noise parameters in the receiver, and particularly in the mixer. Regardless of the type of transceiver used in the system, one or more mixers are used to upconvert the transmit signal to an RF level and to downconvert the received RF signal. A mixer combines the RF signal with a reference signal, referred to as a "local oscillator," or "LO" signal. The resultant signal is the input signal at a different, and, in the case of a downconverter, typically lower, frequency.

The noise performance of a mixer implemented in CMOS technology typically suffers due to so called "1/f" noise (also referred to as flicker noise ) in the mixer core at low frequency offsets. The spectral density of 1/f noise increases significantly as the frequency is reduced. For example, at a low intermediate frequency (IF) offset of 100 kHz, which is a typical frequency to which a received signal is downconverted in a low-IF or a direct conversion receiver, the 1/f noise significantly raises the noise figure (NF) in the receiver. In addition, the large LO and radio frequency (RF) transitions that are used to reduce the noise floor in the mixer contribute to what is referred to as LO self-mixing, where the LO signal is undesirably coupled into the desired receive signal and the combination of the LO signal and the receive signal is undesirably multiplied with the LO signal. The large LO and RF transitions also contribute to RF self-mixing, where the RF signal is undesirably coupled into the LO signal, which leads to a DC signal that is proportional to the RF signal, which further reduce the performance of the receiver. Further, any DC offset mismatch between transistors in the mixer leads to a poor second intercept point (IP2) performance.

Past systems have attempted to minimize the 1/f noise by using a low-IF architecture, implementing large LO signal transitions, or by implementing physically large transistors in the mixer to reduce the effect of the 1/f noise. Unfortunately, these solutions generally consume additional power, degrade linearity of the mixer, contribute to LO self-mixing due to high LO drive power required for the large transistors, and consume additional physical space.

Therefore, it would be desirable to reduce the noise contributed by a mixer in a receiver.

SUMMARY

Embodiments of the invention include a mixer comprising a first mixer core configured to receive a radio frequency (RF) input signal having an RF frequency, and a first local oscillator signal, wherein the first local oscillator signal is at a frequency that is nominally twice the frequency of the RF frequency, the first mixer core configured to switch the RF input signal to at least one secondary mixer core at a frequency that coincides with the frequency of the first local oscillator signal, the at least one secondary mixer core configured to receive the switched RF input signal and a second local oscillator signal, where the second local oscillator signal is at the same nominal frequency as the RF input signal, and wherein switching the RF input signal at the frequency of the first local oscillator signal substantially eliminates noise in the at least one secondary mixer core.

Other embodiments and related methods of operation are also provided. Other systems, methods, features, and advantages of the invention will be or become apparent to one with skill in the art upon examination of the following figures and detailed description. It is intended that all such additional systems, methods, features, and advantages be included within this description, be within the scope of the invention, and be protected by the accompanying claims.

BRIEF DESCRIPTION OF THE FIGURES

The invention can be better understood with reference to the following figures. The components within the figures are not necessarily to scale, emphasis instead being placed upon clearly illustrating the principles of the invention. Moreover, in the figures, like reference numerals designate corresponding parts throughout the different views.

DETAILED DESCRIPTION

Although described with particular reference to a portable transceiver, the mixer can be implemented in any communication device employing a mixer. Further, while described below as being implemented using complimentary metal oxide semiconductor (CMOS) technology, the low noise mixer can be implemented using bipolar or bipolar-CMOS (BiCMOS) technology. Although 1/f noise does not hamper the operation of a bipolar or BiCMOS mixer, the low noise mixer described below, if implemented using bipolar or BiCMOS technology, provides improved I/Q signal/phase matching and improved IP2 performance due to improved mixer core matching.

The low noise mixer can be implemented in hardware, software, or a combination of hardware and software. When implemented in hardware, the low noise mixer can be implemented using specialized hardware elements and logic. When the low noise mixer is implemented partially in software, the software portion can be used to control the mixer components so that various operating aspects can be software-controlled. The software can be stored in a memory and executed by a suitable instruction execution system (microprocessor). The hardware implementation of the low noise mixer can include any or a combination of the following technologies, which are all well known in the art: discreet electronic components, a discrete logic circuit(s) having logic gates for implementing logic functions upon data signals, an application specific integrated circuit having appropriate logic gates, a programmable gate array(s) (PGA), a field programmable gate array (FPGA), etc.

The software for the low noise mixer comprises an ordered listing of executable instructions for implementing logical functions, and can be embodied in any computer-readable medium for use by or in connection with an instruction execution system, apparatus, or device, such as a computer-based system, processor-containing system, or other system that can fetch the instructions from the instruction execution system, apparatus, or device and execute the instructions.

In the context of this document, a "computer-readable medium" can be any means that can contain, store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection (electronic) having one or more wires, a portable computer diskette (magnetic), a random access memory (RAM), a read-only memory (ROM), an erasable programmable read-only memory (EPROM or Flash memory) (magnetic), an optical fiber (optical), and a portable compact disc read-only memory (CDROM) (optical). Note that the computer-readable medium could even be paper or another suitable medium upon which the program is printed, as the program can be electronically captured, via for instance optical scanning of the paper or other medium, then compiled, interpreted or otherwise processed in a suitable manner if necessary, and then stored in a computer memory.

Figure 1:
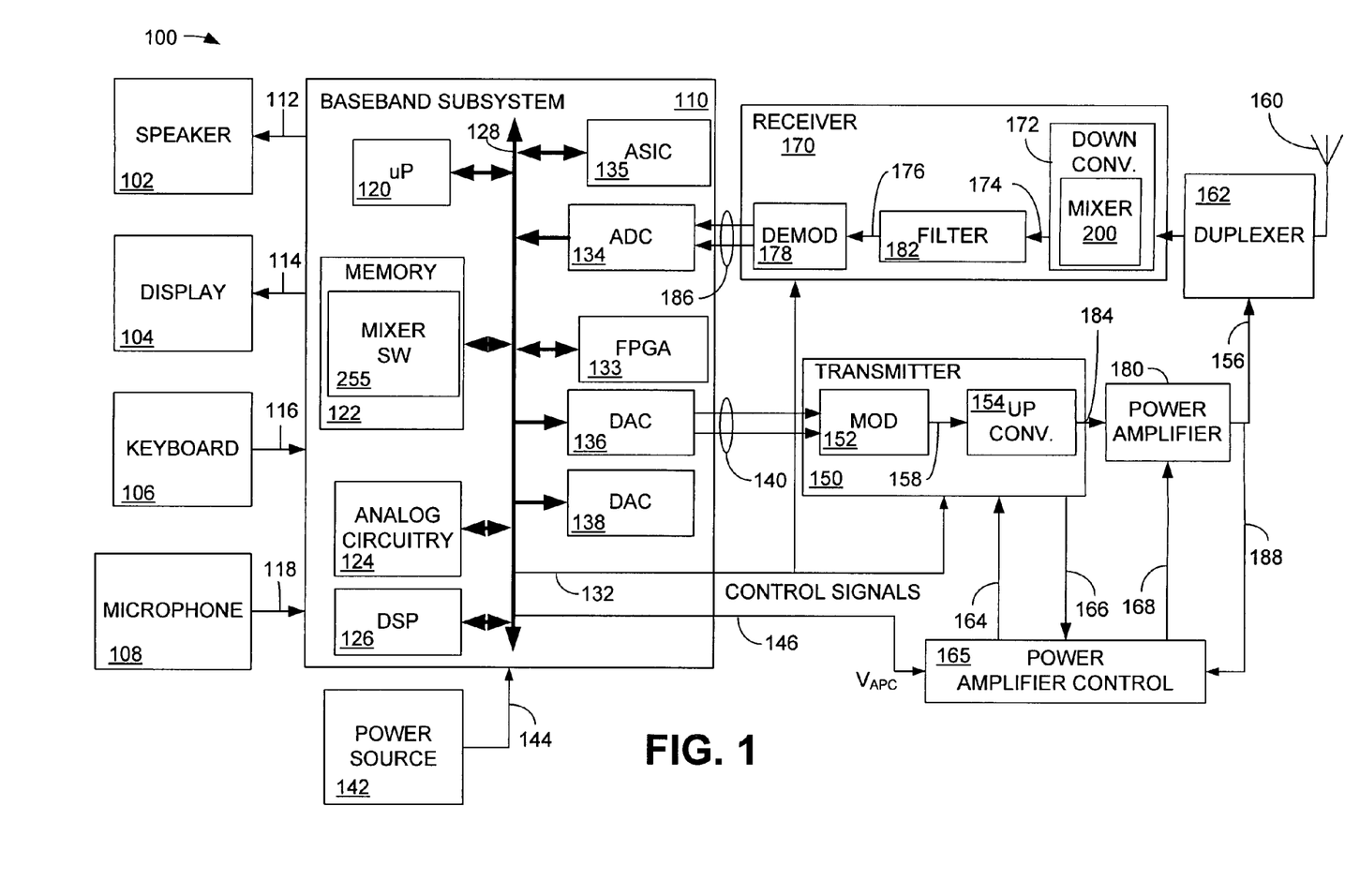
FIG. 1 is a block diagram illustrating a simplified portable transceiver including a mixer.

FIG. 1 is a block diagram illustrating a simplified portable transceiver 100 including a low noise mixer. The portable transceiver 100 includes speaker 102, display 104, keyboard 106, and microphone 108, all connected to baseband subsystem 110. A power source 142, which may be a direct current (DC) battery or other power source, is also connected to the baseband subsystem 110 via connection 144 to provide power to the portable transceiver 100. In a particular embodiment, portable transceiver 100 can be, for example but not limited to, a portable telecommunication handset such as a mobile cellular-type device. Speaker 102 and display 104 receive signals from baseband subsystem 110 via connections 112 and 114, respectively, as known to those skilled in the art. Similarly, keyboard 106 and microphone 108 supply signals to baseband subsystem 110 via connections 116 and 118, respectively. The baseband subsystem 110 includes microprocessor (μP) 120, memory 122, analog circuitry 124, and digital signal processor (DSP) 126 in communication via bus 128. The bus 128, although shown as a single connection, may be implemented using multiple busses connected as necessary among the subsystems within baseband subsystem 110.

Depending on the manner in which the low noise mixer is implemented, the baseband subsystem 110 may also include an application specific integrated circuit (ASIC) 135 and a field programmable gate array (FPGA) 133.

Microprocessor 120 and memory 122 provide the signal timing, processing and storage functions for portable transceiver 100. Analog circuitry 124 provides the analog processing functions for the signals within baseband subsystem 110. The baseband subsystem 110 provides control signals to transmitter 150 and receiver 170 via connection 132 and provides a power control signal, referred to as $V_{APC}$, to a power amplifier control element 165 via connection 146. The acronym "APC" refers to automatic power control. The control signals on connections 132 and 146 may originate from the DSP 126, the ASIC 135, the FPGA 133, or from microprocessor 120, and are supplied to a variety of connections within the transmitter 150, receiver 170 and the power amplifier control element 165. It should be noted that, for simplicity, only the basic components of portable transceiver 100 are illustrated herein. The control signals provided by the baseband subsystem 110 control the various components within the transmitter 150 and the receiver 170. Further, the function of the transmitter 150 and the receiver 170 may be integrated into a transceiver.

If portions of the low noise mixer are implemented in software that is executed by the microprocessor 120, the memory 122 will also include mixer software 255. The mixer software 255 comprises one or more executable code segments that can be stored in the memory and executed in the microprocessor 120. Alternatively, the functionality of the mixer software 255 can be coded into the ASIC 135 or can be executed by the FPGA 133. Because the memory 122 can be rewritable and because the FPGA 133 is reprogrammable, updates to the mixer software 255 can be remotely sent to and saved in the portable transceiver 100 when implemented using either of these methodologies.

The baseband subsystem 110 also includes analog-to-digital converter (ADC) 134 and digital-to-analog converters (DACs) 136 and 138. Although DACs 136 and 138 are illustrated as two separate devices, it is understood that a single digital-to-analog converter may be used that performs the function of DACs 136 and 138. ADC 134, DAC 136 and DAC 138 also communicate with microprocessor 120, memory 122, analog circuitry 124 and DSP 126 via bus 128. The DAC 136 converts the digital communication information within the baseband subsystem 110 into an analog signal for transmission to a modulator 152 via connection 140. Connection 140, while shown as two directed arrows, includes the information that is to be transmitted by the transmitter 150 after conversion from the digital domain to the analog domain.

The transmitter 150 includes modulator 152, which modulates the analog information in connection 140 and provides a modulated signal via connection 158 to upconverter 154. The upconverter 154 transforms the modulated signal on connection 158 to an appropriate transmit frequency and provides the upconverted signal to a power amplifier 180 via connection 184. The power amplifier amplifies the signal to an appropriate power level for the system in which the portable transceiver 100 is designed to operate. Details of the modulator 152 and the upconverter 154 have been omitted for simplicity, as they will be understood by those skilled in the art. For example, the data on connection 140 is generally formatted by the baseband subsystem 110 into in-phase (I) and quadrature-phase (Q) components. The I and Q components may take different forms and be formatted differently depending upon the communication standard being employed.

The power amplifier 180 supplies the amplifier signal via connection 156 to duplexer 162. The duplexer comprises a filter pair that allows simultaneous passage of both transmit signals and receive signals, as known to those having ordinary skill in the art. The transmit signal is supplied from the duplexer 162 to the antenna 160.

If implemented using closed loop power control, a portion of the power of the signal from the power amplifier 180 is coupled via connection 188 to the power amplifier control element 165. Using the power control signal, $V_{APC}$, received via connection 146, the power amplifier control element 165 determines the appropriate power level at which the power amplifier operates to amplify the transmit signal. The power amplifier control element 165 receives information signals from the transmitter 150 via connection 166 and provides information to the transmitter via connection 164. The power amplifier control element 165 also provides a power control signal to the power amplifier 180 via connection 168.

A signal received by antenna 160 will be directed from the duplexer 162 to the receiver 170. The receiver 170 includes a downconverter 172, a filter 182, and a demodulator 178. The downconverter includes a low noise mixer 200 constructed in accordance with embodiments of the invention. If implemented using a direct conversion receiver (DCR), the downconverter 172 converts the received signal from an RF level to a baseband level (DC). Alternatively, the received RF signal may be downconverted to an intermediate frequency (IF) signal, or a low IF signal, depending on the application. The downconverted signal is sent to the filter 182 via connection 174. The filter comprises a least one filter stage to filter the received downconverted signal as known in the art.

The filtered signal is sent from the filter 182 via connection 176 to the demodulator 178. The demodulator 178 recovers the transmitted analog information and supplies a signal representing this information via connection 186 to ADC 134. ADC 134 converts these analog signals to a digital signal at baseband frequency and transfers the signal via bus 128 to DSP 126 for further processing. Although a particular transceiver architecture is depicted in FIG. 1 for reference, the low noise mixer 200 can be implemented in many other transceiver and receiver architectures.

Figure 2:
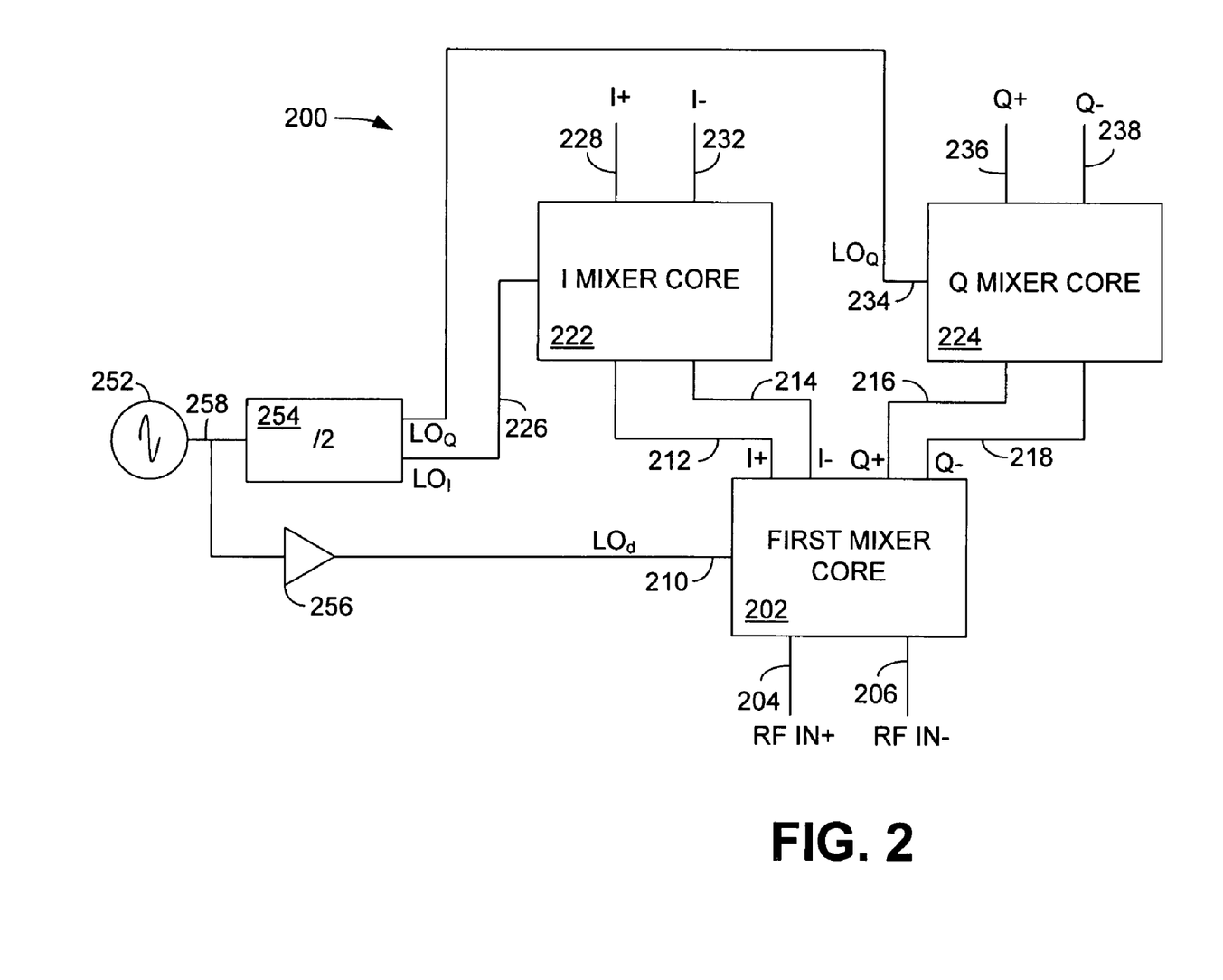
FIG. 2 is a block diagram illustrating the mixer of FIG. 1.

FIG. 2 is a block diagram illustrating the low noise mixer 200 of FIG. 1. The low noise mixer 200 comprises a first, or primary, mixer core 202 and secondary mixer cores 222 and 224. In one embodiment, the first mixer core 202 can be used to receive a radio frequency (RF) signal and provide both in-phase and quadrature-phase signal components. In this example, a local oscillator (LO) signal at a nominal frequency twice the frequency of the received RF signal is supplied to the first mixer core 202 via connection 210. This LO signal is referred to as $LO_d$, although other nomenclature is possible. The $LO_d$ signal can be generated by, for example, an ultra high frequency (UHF) voltage controlled oscillator (VCO) 252 and is supplied to a buffer 256. The delay of the buffer 256 is specified to achieve a desired phase separation between the $LO_d$ signal and the in-phase and quadrature-phase LO signals to be described below. The RF signal to be downconverted is supplied to the first mixer core 202 via connections 204 and 206. In this example, the low noise mixer 200 is differential so that positive and negative representations of the RF signal are supplied via connections 204 and 206, respectively.

The in-phase components are supplied from the first mixer core 202 via connections 212 and 214. The signal on connection 212 is the positive in-phase component and the signal on connection 214 is the negative in-phase component. Similarly, the quadrature-phase components are supplied from the first mixer core 202 via connections 216 and 218. The signal on connection 216 is the positive quadrature-phase component and the signal on connection 218 is the negative quadrature-phase component.

The secondary mixer core 222, which in this example can be referred to as the in-phase (I) mixer core, receives the in-phase components via connections 212 and 214. The secondary mixer core 222 also receives an LO signal ($LO_I$) via connection 226. The $LO_I$ signal can be obtained by dividing the output of the UHF VCO 252 by two (2) in a quadrature divider 254. The $LO_I$ signal has a frequency substantially equal to the frequency of the received RF signal. The I mixer core 222 translates the signal on connections 212 and 214 to positive and negative baseband in-phase signals on connections 228 and 232, respectively.

The secondary mixer core 224, which in this example can be referred to as the quadrature-phase (Q) mixer core, receives the quadrature-phase components via connections 216 and 218. The secondary mixer core 224 also receives an LO signal ($LO_Q$) from the divider 254 via connection 234. The $LO_Q$ signal has a frequency substantially equal to the frequency of the received RF signal. The Q mixer core 224 translates the signal on connections 216 and 218 to positive and negative baseband quadrature-phase signals on connections 236 and 238, respectively.

In an embodiment in accordance with the invention, and as will be described in detail below, the first mixer core 202 is switched at a frequency ($LO_d$) that is nominally two times the frequency of the RF input signal on connections 204 and 206. When the $LO_d$ signal supplied to the first mixer core 202 is logic high, the current associated with the input RF signal is routed to the I mixer core 222. When the $LO_d$ signal supplied to the first mixer core 202 is logic low, the current associated with the input RF signal is routed to the Q mixer core 224. The $LO_I$ and $LO_Q$ signals used to switch the secondary mixer cores 222 and 224 are at a frequency equal to the frequency of the RF input signal. The phase of the $LO_d$ signal and the $LO_I$ and $LO_Q$ signals is established so that no current flows through the I mixer core 222 when the $LO_I$ signal supplied to the I mixer core 222 is transitioning between logic low and logic high; and such that no current flows through the Q mixer core 224 when the $LO_Q$ signal supplied to the Q mixer core 224 is transitioning between logic low and logic high. If the low noise mixer 200 is implemented in a low IF receiver, there will be a small offset in frequency, on the order of few tens to a few hundreds of kilohertz (KHz), between RF and $LO_d$ divided by two.

In a non-quadrature application, only one of the quadrature outputs of the first mixer core 202 is used. In such an implementation one of the two quadrature outputs on connections 212/214 and 216/218 is used. The current on the unused quadrature output can be connected to supply or ground.

In another embodiment, the mixer topology shown in FIG. 2 can be used for signal up-conversion in a wireless transmitter. In such an implementation, either a differential or a single-ended I and Q input signal, at baseband or low frequency, is supplied over connections 228 and 232 to the I mixer core 222 and over connections 236 and 238 to the Q mixer core 224. In this example, the input signal is differential for both in-phase and quadrature-phase. The in-phase input signal is upconverted using the $LO_I$ signal in the I mixer core 222 and the quadrature-phase input signal is upconverted using the $LO_Q$ signal in the Q mixer core 224. The output of the I mixer core 222 at the $LO_I$ frequency is then supplied via connections 212 and 214 to the first mixer core 202. The output of the Q mixer core 224, at the $LO_Q$ frequency is then supplied via connections 216 and 218 to the first mixer core 202. The output of the I mixer core 222 and the output of the Q mixer core 224 are then mixed with 2*LO ($LO_d$) in the first mixer core 202, providing an RF output signal on connections 204 and 206.

Using the topology described in FIG. 2, a high degree of matching between I and Q channels and opposite side-band rejection is obtained. Further, a high degree of isolation between the $LO_I$ and the $LO_Q$ signals and the output on connections 204 and 204 leads to reduced LO leakage. Further still, because only the first mixer 202 contributes to the phase noise of the mixer 200, the phase noise at the RF output on connections 204 and 206 is also improved.

Figure 3A:
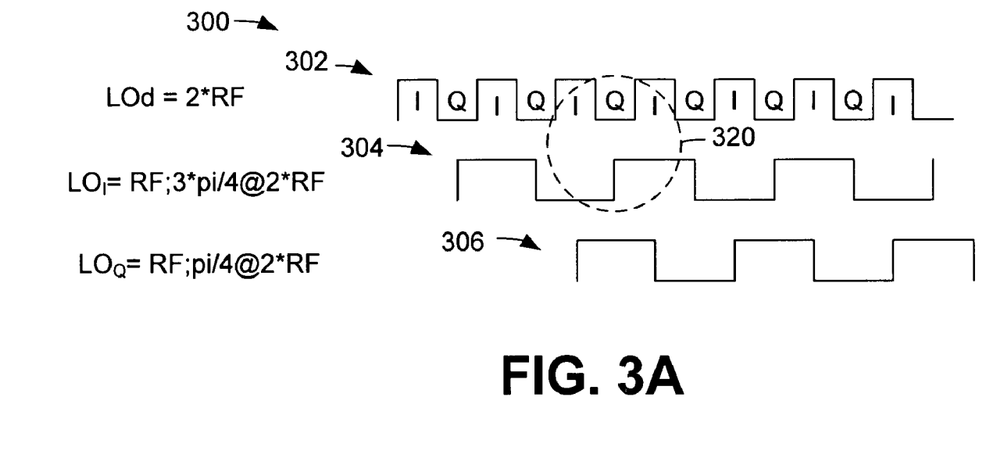
FIGS. 3A and 3B collectively show a timing diagram illustrating an embodiment of the invention.
Figure 3B:
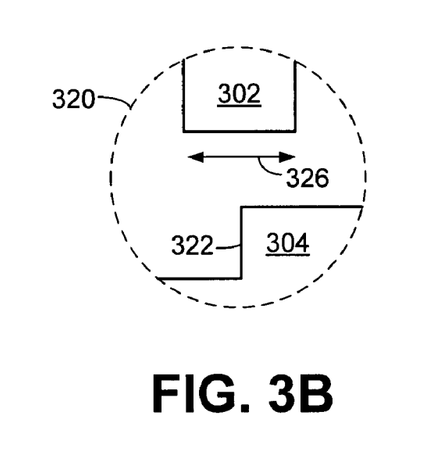

FIGS. 3A and 3B collectively show a timing diagram illustrating an embodiment of the invention. The $LO_d$ signal supplied to the first mixer core 202 at a nominal frequency of 2*RF is illustrated using pulse train 302. The $LO_I$ signal supplied to the I mixer core 222 is illustrated using pulse train 304 and the $LO_Q$ signal supplied to the Q mixer core 224 is illustrated using pulse train 306. The frequency of the $LO_I$ signal is the nominally same frequency as that of the received RF signal and the phase of the $LO_I$ signal is given by $LO_I=3*pi/4@2*RF$. The frequency of the $LO_Q$ signal is nominally the same frequency as that of the received RF signal and the phase of the $LO_Q$ signal is given by $LO_Q=pi/4@2*RF$.

Referring to the timing diagram 300 and the pulse train 302, when the $LO_d$ signal is logic high, the current associated with the input RF signal is routed to the I mixer 222. When the $LO_d$ signal supplied to the first mixer 202 is logic low, the current associated with the input RF signal is routed to the Q mixer 224. Referring to the timing diagram 300 and the pulse train 304, switching in the I mixer core 222 occurs when current is being supplied from the first mixer core 202 to the Q mixer core 224, and no current is being supplied to the I mixer core 222. The switching is denoted by logic low to logic high and logic high to logic low transitions of the pulse train 304. Similarly, referring to the timing diagram 300 and pulse train 306, switching in the Q mixer core 224 occurs when current is being supplied from the first mixer core 202 to the I mixer core 222, and no current is being supplied to the Q mixer core 224.

As shown in FIG. 3B as applied to switching in the I mixer core 222, an edge 322 of the $LO_I$ signal occurs within the time period indicated by the arrow 326, which is the duration of time that the $LO_d$ signal is routing input RF current to the Q mixer 224. This illustrates that the edge 322 of the pulse train 304, which corresponds to switching in the I mixer core 222, can vary in time, so long as it remains within the time period indicated using arrow 326. In this manner, switching on the I mixer core 222 can occur when current is being supplied to the Q mixer core 224, resulting in no 1/f noise being generated in the I mixer core 222. Although not shown, the same situation applies to the $LO_Q$ signal and the Q mixer core 224. In this manner, 1/f noise from the I mixer 222 and the Q mixer 224 is significantly reduced or eliminated.

Figure 4:
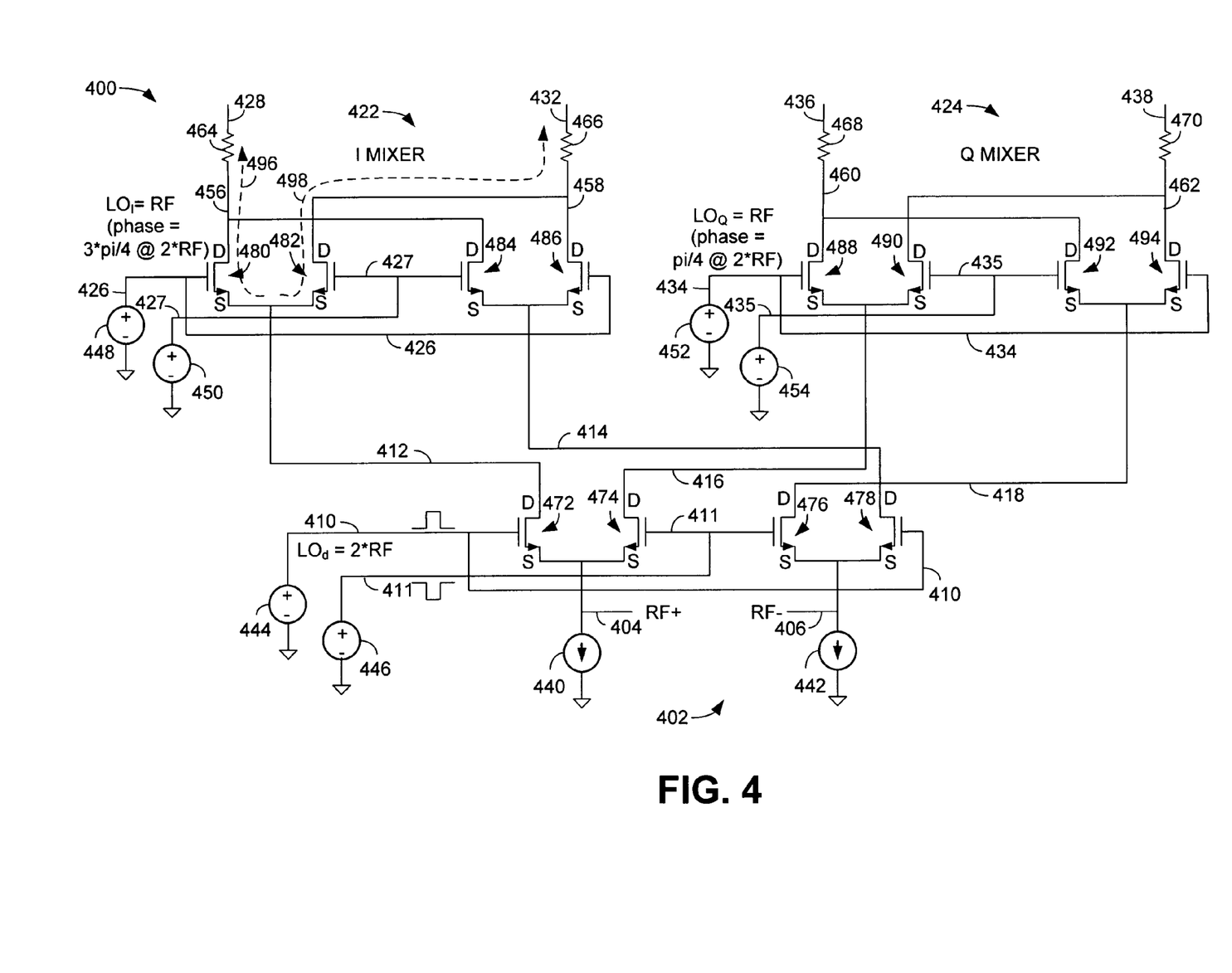
FIG. 4 is a schematic diagram illustrating an embodiment of the mixer of FIG. 2 in accordance with an embodiment of the invention.

FIG. 4 is a schematic diagram illustrating an embodiment of the low noise mixer of FIG. 2 in accordance with an embodiment of the invention. The implementation shown in FIG. 4 illustrates a low noise mixer 400 implemented using only CMOS technology. The low noise mixer 400 comprises a first mixer core 402 and secondary mixer cores 422 and 424. The secondary mixer core 422 operates on the in-phase component of the RF signal and the secondary mixer core 424 operates on the quadrature-phase component of the RF signal. A differential RF input signal is supplied to the first mixer core 402 via connections 404 and 406. A positive representation of the RF input signal is supplied via connection 404 and a negative representation of the RF input signal is supplied via connection 406. The RF signal on connection 404 is illustrated using current source 440 and the RF signal on connection 406 is illustrated using current source 442.

The first mixer core 402 comprises transistors 472, 474, 476 and 478. The transistors 472, 474, 476 and 478 are illustratively npn field effect transistors (FETs), but can be other transistor configurations, such as bipolar, BiCMOS and other designs. The source terminals of transistors 472 and 474 are coupled to the positive RF input signal on connection 404. The source terminals of the transistors 476 and 478 are coupled to the negative RF input signal on connection 406. The differential $LO_d$ signal is supplied to the gate terminals of the transistors 472, 474, 476 and 478. The gate terminals of the transistors 472 and 478 are coupled to a positive representation of the $LO_d$ signal and the gate terminals of the transistors 474 and 476 are coupled to a negative representation of the $LO_d$ signal. The $LO_d$ signal is at a frequency that is nominally twice the frequency of the received RF input signal on connections 404 and 406. The $LO_d$ signal is shown as being supplied from voltage sources 444 and 446. The voltage sources 444 and 446 can be, for example, an ultra high frequency (UHF) voltage controlled oscillator (VCO), similar to the UHF VCO 252 (FIG. 2), or another oscillator that can provide the $LO_d$ signal to the transistors 472, 474, 476 and 478.

The drain terminal of the transistor 472 provides the positive representation of the in-phase component, the drain terminal of the transistor 478 provides the negative representation of the in-phase component, the drain terminal of the transistor 474 provides the positive representation of the quadrature-phase component, and the drain terminal of the transistor 476 provides the negative representation of the quadrature-phase component.

The I mixer core 422 comprises transistors 480, 482, 484 and 486. The transistors 480, 482, 484 and 486 are illustratively npn field effect transistors (FETs), but can be other transistor configurations, such as bipolar, BiCMOS, and other designs. For example, in a low voltage implementation, the transistors 480, 482, 484 and 486 can be implemented as positive channel MOS (PMOS) devices biased to operate as switches.

The source terminals of transistors 480 and 482 are coupled to the positive in-phase component on connection 412 and the source terminals of transistors 484 and 486 are coupled to the negative in-phase component on connection 414. The Q mixer core 424 comprises transistors 488, 490, 492 and 494. The transistors 488, 490, 492 and 494 are illustratively npn field effect transistors (FETs), but can be other transistor configurations, such as bipolar, BiCMOS, and other designs. For example, the transistors 488, 490, 492 and 494 can be implemented as positive channel MOS (PMOS) devices biased to operate as switches. The source terminals of transistors 488 and 490 are coupled to the positive quadrature-phase component on connection 416 and the source terminals of transistors 492 and 494 are coupled to the negative quadrature-phase component on connection 418.

The gate terminals of the transistors 480 and 486 are coupled to a positive representation of the $LO_I$ signal and the gate terminals of the transistors 482 and 484 are coupled to a negative representation of the $LO_I$ signal. The gate terminals of the transistors 488 and 494 are coupled to a positive representation of the $LO_Q$ signal and the gate terminals of the transistors 490 and 492 are coupled to a negative representation of the $LO_Q$ signal. The $LO_I$ signal is supplied from the voltage sources 448 and 450 and the $LO_Q$ signal is supplied from the voltage sources 452 and 454. The $LO_I$ and $LO_Q$ signals are at a frequency that is nominally the same frequency as that of the received RF input signal on connections 404 and 406. The voltage sources 448, 450, 452 and 454 can be, for example, an ultra high frequency (UHF) voltage controlled oscillator (VCO), or another oscillator that can provide the $LO_I$ and $LO_Q$ signal to the transistors 480, 482, 484, 486, 488, 490, 492 and 494. One method of generating the $LO_I$ and $LO_Q$ signals is to divide the $LO_d$ signal in the quadrature divider (254 in FIG. 2) that yields $LO_I$ and $LO_Q$ signals. The phase differences between the $LO_d$ and the $LO_I$, and $LO_Q$ signals, desired for low 1/f noise from the mixer 400 and as shown in FIG. 3, are realized by adjusting the delay of the buffer 256 (shown in FIG. 2, but omitted from FIG. 4 for clarity) in the $LO_d$ path.

The differential in-phase component outputs are provided on connections 428 and 432. The drain terminals of transistors 480 and 484 are coupled through the resistor 464 to the connection 428. The drain terminals of transistors 482 and 486 are coupled through the resistor 466 to the connection 432. The differential quadrature-phase component outputs are provided on connections 436 and 438. The drain terminals of transistors 488 and 492 are coupled through the resistor 468 to the connection 436. The drain terminals of transistors 490 and 494 are coupled through the resistor 470 to the connection 438. Many possible implementations of the output stage, or circuit, of the mixer 400 are possible. The simplest output stage, a resistor, is shown here. In an actual implementation the output stage is generally a trans-impedance amplifier. A trans-impedance amplifier is an operational amplifier with a resistor in the feedback path from the input to the output of the operational amplifier. The operational amplifier generates a voltage at it's output that is equal to the mixer's output current multiplied by the feedback resistor value, while allowing the mixer output nodes (456, 458, 460, 462) to be at virtual ground (or very low voltage swing on these nodes).

The first mixer core 402 is switched at a frequency ($LO_d$) that is nominally two times the RF frequency. When the $LO_d$ signal supplied to the first mixer core 402 is logic high, the current associated with the input RF signal is routed to the I mixer core 422. When the $LO_d$ signal supplied to the first mixer core 402 is logic low, the current associated with the input RF signal is routed to the Q mixer core 424. The $LO_I$ and $LO_Q$ signals used to switch the secondary mixer cores 422 and 424 are at a frequency nominally equal to the frequency of the input RF signal. The phase of the $LO_d$ signal and the $LO_I$ and $LO_Q$ signals is established so that no current flows through the I mixer core 422 when the $LO_I$ signal supplied to the I mixer core 422 is transitioning between logic low and logic high (applies to both logic low to logic high and logic high to logic low transitions); and such that no current flows through the Q mixer core 424 when the $LO_Q$ signal supplied to the Q mixer core 424 is transitioning between logic low and logic high (both logic low to logic high and logic high to logic low transitions).

As an example, and referring to the timing diagram shown in FIGS. 3A and 3B, when the $LO_d$ signal is logic high, the current associated with the RF input signal flows through the transistors 472 and 478 to the I mixer core 422. The current through the transistor 472 flows to the transistors 480 and 482, and the current through the transistor 478 flows to the transistors 484 and 486. When the $LO_d$ signal is logic low, no current flows through the transistors 472 and 478. Consequently, no current flows to the transistors 480, 482, 484 or 486. This is the point n time when the $Lo_I$ signal transitions to logic high (in the example shown in FIG. 3B) to switch the I mixer core 422. At this time, there is no current on the source terminals of the transistors 480, 482, 484 or 486, and therefore, 1/f noise is eliminated. The same applies to signal transitions from logic high to logic low. When $LO_d$ is low, no current flows to the transistors 480, 482, 484 or 486. The same applies to the Q mixer core 424 when the $LO_d$ signal is logic low.

The switching time of the edges 322 of the local oscillator signal to the I and Q mixer cores can vary within the duration 326 (FIG. 3B) of the $LO_d$ signal without having effect on the current that is flowing into the resistors 464, 466, 468 and 470, thereby substantially reducing, or eliminating 1/f noise from the I mixer core 422 and the Q mixer core 424. FIG. 3B illustrates the case for the leading edge of the I mixer core. However, the same is true for the falling edges of the pulse train 304 (FIGS. 3A and 3B) and for the leading and falling edges of the Q mixer core, pulse train 306 (FIGS. 3A and 3B).

The 1/f noise from the first mixer core 402 is converted to a common mode DC signal at the outputs 428, 432, 436 and 438. For example, switching the output of the transistor 472 through the transistors 480 and 482, and through the resistors 464 and 466, respectively, as shown using the arrows 496 and 498, substantially eliminates the 1/f noise from the transistor 472 because the net difference in current through the resistors 464 and 466 is zero. The 1/f noise from the transistors 474, 476 and 478 is similarly reduced or eliminated. The low noise mixer 400 generates little 1/f noise and exhibits a low noise figure.

Further, for the same reasons described above, any threshold voltage or turn-on voltage mismatch between and among the elements in the mixer cores 402, 422 and 424 causes little, if any, performance degradation, leading to improved IP2 performance. Lower 1/f noise in the mixer cores allows the use of smaller core devices that could improve the linearity and reduce the LO drive power required to switch these devices. The reduced LO drive power can potentially reduce DC offset caused by LO self-mixing in DCRs.

In accordance with another embodiment of the invention, the first mixer core 402 generates both the in-phase and quadrature-phase components of the RF signal. Quadrature match in phase and amplitude is mainly a function of the duty cycle of the local oscillator signal at twice (nominally) the RF frequency. This enables excellent I/Q quadrature match. The performance and the accuracy of the local oscillator phases of the I mixer core 422 and the Q mixer core 424 are no longer critical due to the timing of the edges of the $LO_I$ and $LO_Q$ signals being allowed to fall within the pulse width of the $LO_d$ local oscillator signal, as shown in FIG. 3B.

Figure 5:
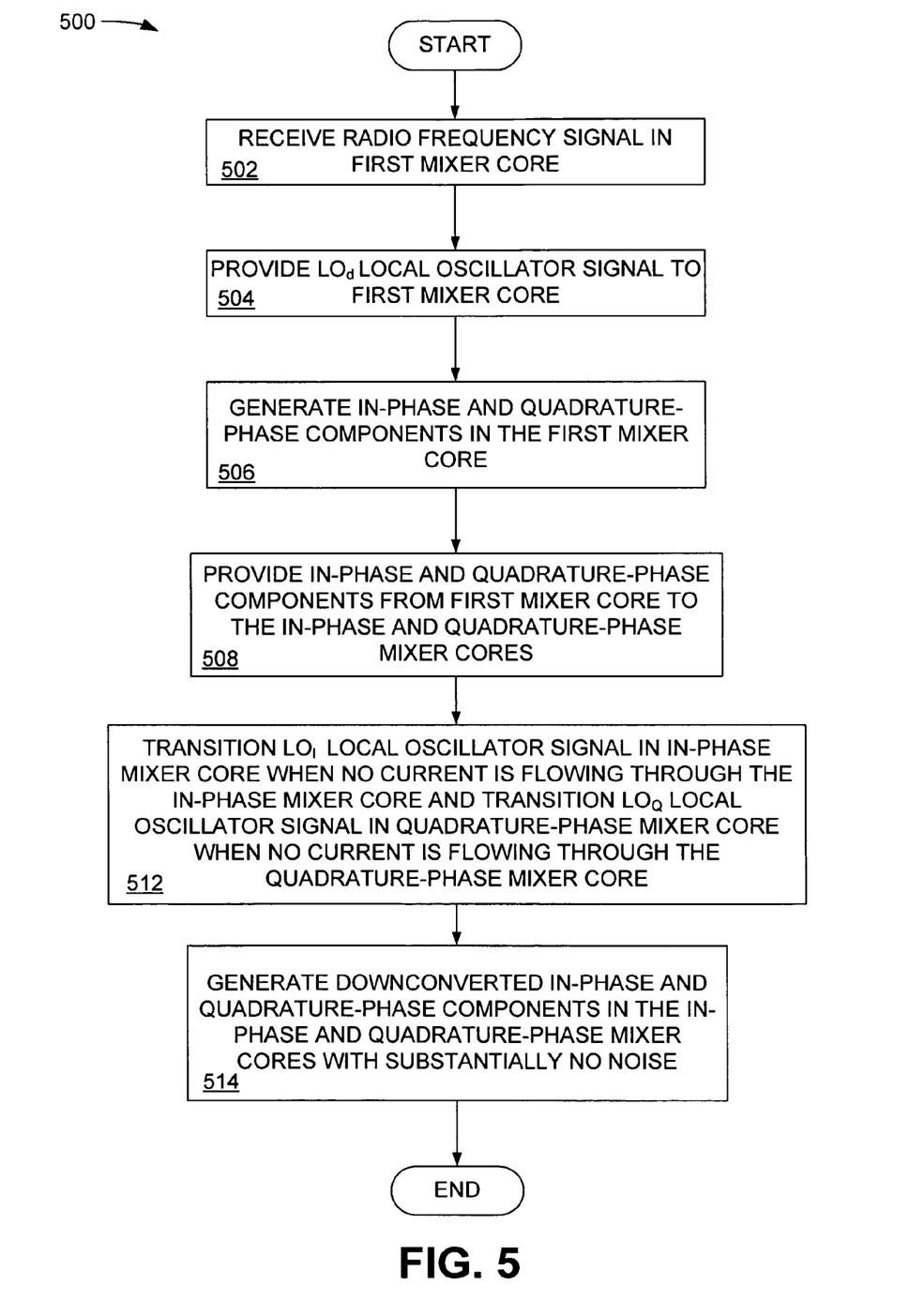
FIG. 5 is a flow chart describing the operation of an embodiment of the mixer.

FIG. 5 is a flow chart 500 describing the operation of an embodiment of the low noise mixer. The flowchart 500 is meant to illustrate one possible embodiment of the low noise mixer 400. The blocks in the flowchart 500 may be performed out of the order shown or can be performed substantially in parallel. In block 502 an RF signal is received in the CMOS mixer 400. In block 504 a first local oscillator signal, referred to as $LO_d$ is provided to the first mixer core 402 in the low noise mixer 400. The $LO_d$ signal is at a nominal frequency that is twice the frequency of the RF input signal. In block 506, the first mixer core 402 generates in-phase and quadrature-phase components. In accordance with an embodiment of the invention, by supplying the first mixer core with an LO signal ($LO_d$) that has a frequency that is twice the frequency of the RF input signal, both the in-phase and the quadrature-phase components can be generated without using any phase shifting circuitry.

In block 508, the in-phase and quadrature phase components are provided to the in-phase mixer core 422 and the quadrature-phase mixer core 424. In block 512, the $LO_I$ and $LO_Q$ local oscillator signals are provided to the in-phase mixer core 422 and the quadrature-phase mixer core 424, respectively. As shown in FIGS. 3A and 3B, the $LO_I$ signal is transitioned when zero current is flowing through the in-phase mixer core 422 and the $LO_Q$ signal is switched when zero current is flowing through the quadrature-phase mixer core 424. The timing of the $LO_I$ and $LO_Q$ signals with respect to the timing of the $LO_d$ signal substantially eliminates the noise that would otherwise be generated by the in-phase mixer core 422 and the quadrature-phase mixer core 424. In addition, switching the output of the first mixer core 402 through the resistors associated with the in-phase mixer core 422 and the quadrature-phase mixer core 424 substantially eliminates any noise that would otherwise be generated by the first mixer core 404.

In block 514, the in-phase mixer core 422 and the quadrature-phase mixer core 424 generate the downconverted in-phase and quadrature-phase components with substantially no noise.

While various embodiments of the invention have been described, it will be apparent to those of ordinary skill in the art that many more embodiments and implementations are possible that are within the scope of this invention. Accordingly, the invention is not to be restricted except in light of the attached claims and their equivalents.

What is claimed is:

1. A low noise mixer, comprising:
a first mixer core configured to receive a radio frequency (RF) input signal having an RF frequency, and a first local oscillator signal, wherein the first local oscillator signal is at a frequency that is nominally twice the frequency of the RF frequency, the first mixer core configured to switch the RF input signal to at least one secondary mixer core at a frequency that coincides with the frequency of the first local oscillator signal;
the at least one secondary mixer core configured to receive the switched RF input signal and a second local oscillator signal, where the second local oscillator signal is at the same nominal frequency as the RF input signal; and
wherein switching the RF input signal at the frequency of the first local oscillator signal substantially eliminates noise in the at least one secondary mixer core.

2. The mixer of claim 1, further comprising at least one output circuit at an output of the at least one secondary mixer core, and wherein switching the RF input signal at the frequency of the first local oscillator signal through the at least one secondary mixer substantially eliminates noise in the first mixer core.

3. The mixer of claim 2, wherein the first local oscillator signal having a frequency that is nominally twice the frequency of the RF frequency allows in-phase and quadrature-phase components to be generated from the RF input signal.

4. The mixer of claim 3, wherein the at least one secondary mixer core is configured to operate on an in-phase component of the RF signal and the second local oscillator signal has a phase of $3*pi/4@2*RF$.

5. The mixer of claim 3, wherein the at least one secondary mixer core is configured to operate on a quadrature-phase component of the RF signal and the second local oscillator signal has a phase of $pi/4@2*RF$.

6. The mixer of claim 3, wherein the at least one secondary mixer core further comprises an in-phase mixer core and a quadrature-phase mixer core, and the in-phase mixer core switches only when the first mixer core is providing current to the quadrature-phase mixer core, and the quadrature-phase mixer core switches only when the first mixer core is providing current to the in-phase mixer core.

7. A method for downconverting a radio frequency (RF) signal in a low noise mixer, comprising:
receiving in a first mixer core a radio frequency (RF) input signal having an RF frequency;
supplying to the first mixer core a first local oscillator signal, wherein the first local oscillator signal is at a frequency that is nominally twice the frequency of the RF frequency;
switching, in the first mixer core, the RF input signal to at least one secondary mixer core at a frequency that coincides with the frequency of the first local oscillator signal;
receiving, in the at least one secondary mixer core the switched RF input signal and a second local oscillator signal, where the second local oscillator signal is at the same nominal frequency as the RF input signal; and
switching the RF input signal at the frequency of the first local oscillator signal to substantially eliminate noise in the at least one secondary mixer core.

8. The method of claim 7, further comprising:
providing at least one output circuit at an output of the at least one secondary mixer core; and
switching the RF input signal at the frequency of the first local oscillator signal through the at least one secondary mixer to substantially eliminate noise in the first mixer core.

9. The method of claim 8, wherein the first local oscillator signal having a frequency that is nominally twice the frequency of the RF frequency allows in-phase and quadrature-phase components to be generated from the RF input signal.

10. The method of claim 9, wherein the at least one secondary mixer core is configured to operate on an in-phase component of the RF signal and the second local oscillator signal has a phase of $3*pi/4@2*RF$.

11. The method of claim 9, wherein the at least one secondary mixer core is configured to operate on a quadrature-phase component of the RF signal and the second local oscillator signal has a phase of $pi/4@2*RF$.

12. The method of claim 7, wherein the mixer is implemented in a transmitter as an upconverter.

13. A portable transceiver, comprising:
a transceiver for transmitting and receiving a radio frequency (RF) signal;
a first mixer core configured to receive a radio frequency (RF) input signal having an RF frequency, and a first local oscillator signal, wherein the first local oscillator signal is at a frequency that is nominally twice the frequency of the RF frequency, the first mixer core configured to switch the RF input signal to at least one secondary mixer core at a frequency that coincides with the frequency of the first local oscillator signal;
the at least one secondary mixer core configured to receive the switched RF input signal and a second local oscillator signal, where the second local oscillator signal is at the same nominal frequency as the RF input signal; and
wherein switching the RF input signal at the frequency of the first local oscillator signal substantially eliminates noise in the at least one secondary mixer core.

14. The portable transceiver of claim 13, further comprising at least one output circuit at an output of the at least one secondary mixer core, and wherein switching the RF input signal at the frequency of the first local oscillator signal through the at least one secondary mixer substantially eliminates noise in the first mixer core.

15. The portable transceiver of claim 14, wherein the first local oscillator signal having a frequency that is nominally twice the frequency of the RF frequency allows in-phase and quadrature-phase components to be generated from the RF input signal.

16. The portable transceiver of claim 15, wherein the at least one secondary mixer core is configured to operate on an in-phase component of the RF signal and the second local oscillator signal has a phase of 3*pi/4@2*RF.

17. The portable transceiver of claim 15, wherein the at least one secondary mixer core is configured to operate on a quadrature-phase component of the RF signal and the second local oscillator signal has a phase of pi/4@2*RF.

18. The portable transceiver of claim 13, wherein the first mixer core and the at least one secondary mixer core are implemented in a transmitter as an upconverter.

19. The portable transceiver of claim 13, wherein the first mixer core is configured to switch the RF input signal to at least one secondary mixer core at a frequency that is twice the frequency at which the at least one secondary mixer core switches.

20. The portable transceiver of claim 19, wherein the at least one secondary mixer core further comprises an in-phase mixer core and a quadrature-phase mixer core, and the in-phase mixer core switches only when the first mixer core is providing current to the quadrature-phase mixer core, and the quadrature-phase mixer core switches only when the first mixer core is providing current to the in-phase mixer core.

* * * * *